United States Patent
Chung et al.

(10) Patent No.: US 9,679,984 B2
(45) Date of Patent: Jun. 13, 2017

(54) METAL GATE STRUCTURE WITH MULTI-LAYER COMPOSITION

(71) Applicant: Taiwan Semiconductor Manufacturing Company, Ltd., Hsin-Chu (TW)

(72) Inventors: Hung-Chin Chung, Pingzhen (TW); Shiang-Rung Tsai, Hsinchu (TW); Hsien-Ming Lee, Changhua (TW); Cheng-Lung Hung, Hsinchu (TW); Hsiao-Kuan Wei, Longtan Township, Taoyuan County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 48 days.

(21) Appl. No.: 13/871,555

(22) Filed: Apr. 26, 2013

(65) Prior Publication Data
US 2014/0124875 A1 May 8, 2014

Related U.S. Application Data

(60) Provisional application No. 61/723,470, filed on Nov. 7, 2012.

(51) Int. Cl.
*H01L 29/49* (2006.01)
*H01L 29/78* (2006.01)
(Continued)

(52) U.S. Cl.
CPC .... *H01L 29/4966* (2013.01); *H01L 21/28079* (2013.01); *H01L 21/28088* (2013.01);
(Continued)

(58) Field of Classification Search
None
See application file for complete search history.

(56) References Cited

U.S. PATENT DOCUMENTS 6,054,355 A * 4/2000 Inumiya et al. ............. 438/296
8,652,890 B2 * 2/2014 Schmidbauer .... H01L 21/28088
257/412

(Continued)

FOREIGN PATENT DOCUMENTS

CN 101661936 A 3/2010
CN 102903741 A 1/2013
(Continued)

OTHER PUBLICATIONS

PubChem. Tetraethyl orthosilicate | C8H20O4Si. [retrieved Jan. 26, 2015] Retrieved from the Internet: <URL: http://pubchem.ncbi.nlm.nih.gov/compound/Tetraethyl_orthosilicate >.*

*Primary Examiner* — Hoang-Quan Ho
(74) *Attorney, Agent, or Firm* — Haynes and Boone, LLP

(57) ABSTRACT

The present disclosure provides a semiconductor structure. The semiconductor structure includes a semiconductor substrate and a gate stack disposed on the semiconductor substrate. The gate stack includes a high-k dielectric material layer, a titanium-rich TiN layer over the high-k dielectric layer, and a metal layer disposed over the titanium-rich TiN layer. The metal layer includes aluminum.

19 Claims, 4 Drawing Sheets

(51) Int. Cl.
*H01L 29/51* (2006.01)
*H01L 21/28* (2006.01)
*H01L 29/40* (2006.01)
*H01L 29/66* (2006.01)

(52) U.S. Cl.
CPC ...... *H01L 29/401* (2013.01); *H01L 29/66545* (2013.01); *H01L 29/78* (2013.01)

(56) References Cited

U.S. PATENT DOCUMENTS

| | | | |
|---|---|---|---|
| 2003/0022422 A1* | 1/2003 | Torii et al. | 438/183 |
| 2006/0163630 A1* | 7/2006 | Callegari et al. | 257/295 |
| 2010/0052075 A1* | 3/2010 | Yeh et al. | 257/410 |
| 2011/0140206 A1* | 6/2011 | Lin et al. | 257/411 |
| 2011/0221009 A1* | 9/2011 | Chuang et al. | 257/392 |
| 2011/0221012 A1* | 9/2011 | Bu et al. | 257/411 |
| 2011/0223774 A1* | 9/2011 | Kweskin et al. | 438/790 |
| 2012/0052641 A1* | 3/2012 | Lee et al. | 438/270 |
| 2012/0211844 A1* | 8/2012 | Schloesser et al. | 257/410 |
| 2013/0020655 A1* | 1/2013 | Mieno | 257/408 |
| 2013/0026578 A1* | 1/2013 | Tsau | H01L 21/82384 257/368 |
| 2013/0078792 A1* | 3/2013 | Huang et al. | 438/591 |
| 2013/0087856 A1* | 4/2013 | Ortolland et al. | 257/365 |
| 2013/0161754 A1* | 6/2013 | Su et al. | 257/369 |
| 2013/0200393 A1* | 8/2013 | Chen et al. | 257/77 |
| 2013/0224927 A1* | 8/2013 | Schmidbauer | H01L 21/28088 438/299 |
| 2013/0249010 A1* | 9/2013 | Ng et al. | 257/369 |
| 2013/0264652 A1* | 10/2013 | Zhu et al. | 257/369 |

FOREIGN PATENT DOCUMENTS

| | | |
|---|---|---|
| JP | 2008511176 | 4/2008 |
| KR | 20070078975 | 8/2007 |

* cited by examiner

METAL GATE STRUCTURE WITH MULTI-LAYER COMPOSITION

BACKGROUND

This patent claims the benefit of U.S. Prov. No. 61/723,470 filed Nov. 7, 2012, the disclosure of which is hereby incorporated by reference.

In advanced technology nodes of integrated circuit industry, high k dielectric material and metal are adopted to form a gate stack of a field-effect transistor (FET) such as a metal-oxide-semiconductor field-effect transistors (MOSFETs). Metal gate stacks are often planarized, such as by chemical-mechanical polishing (CMP), and it is common to have the resulting gate height after CMP be relatively short. This can result in undesired consequences, such as increased defects (e.g., hump defects) and poor on/off (Ion/Ioff) device performance. Therefore, a structure of a metal gate stack and a method making the same are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
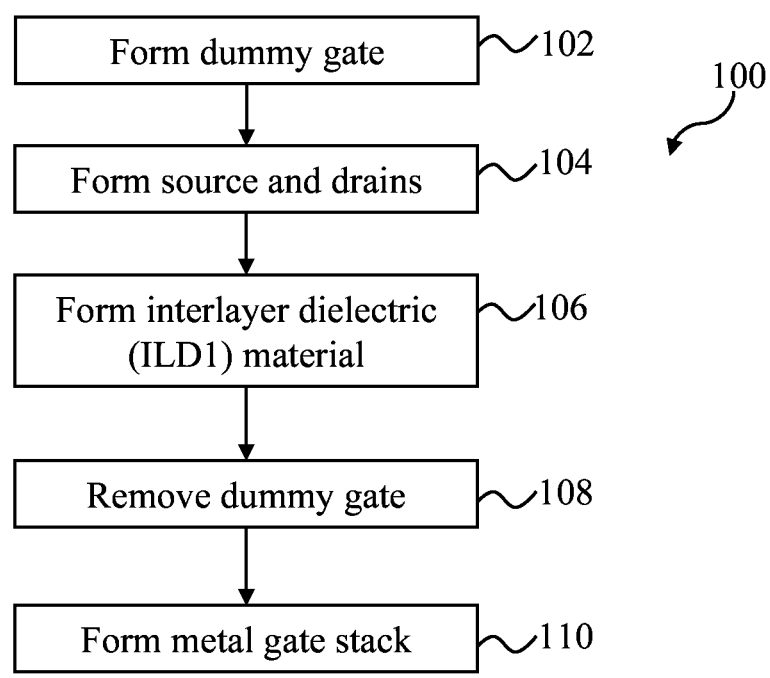
FIGS. 1 and 3 are a flowchart of a method for making a semiconductor device having a metal gate stack constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
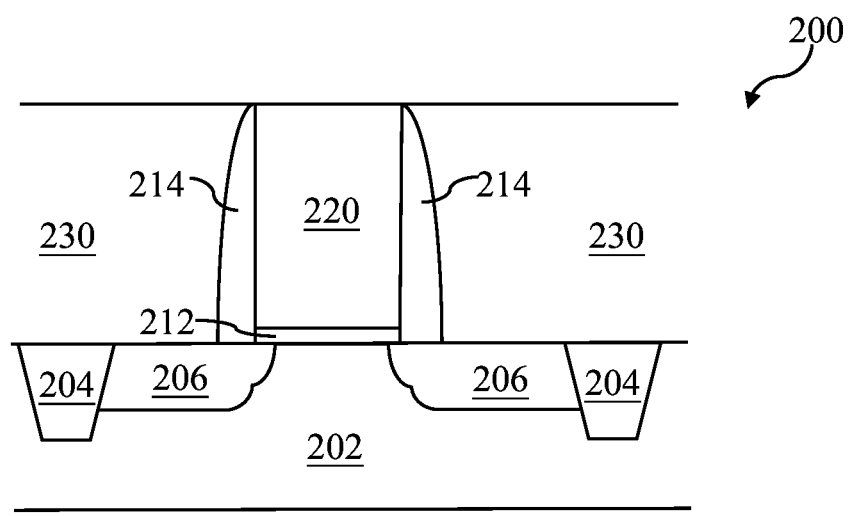
FIGS. 2 and 4 are sectional views of a semiconductor device having a metal gate stack at various fabrication stages constructed according to various aspects of the present disclosure in one or more embodiments.

FIG. 1 is a flowchart of one embodiment of a dummy-gate method 100 for use in making a semiconductor device having a gate stack constructed according to aspects of the present disclosure. FIG. 2 provides a sectional view of one embodiment of a semiconductor structure 200 having a gate stack at various fabrication stages. The semiconductor structure 200 and the method 100 of making the same are collectively described with reference to FIGS. 1 and 2. It is understood that a dummy gate (or gate-last) process is described as an exemplary embodiment, which is not intended to be limiting except and unless as explicitly recited in the claims.

The method 100 begins at step 102 by providing a semiconductor substrate 202. The semiconductor substrate 202 includes silicon. Alternatively, the substrate 202 includes germanium or silicon germanium. In other embodiments, the substrate 202 may use another semiconductor material such as diamond, silicon carbide, gallium arsenic, GaAsP, AlInAs, AlGaAs, GaInP, or other proper combination thereof.

The semiconductor substrate also includes various doped regions such as n-well and p-wells formed by a proper technique, such as ion implantation. The semiconductor substrate 202 also includes various isolation features, such as shallow trench isolation (STI) 204, formed in the substrate to separate various devices. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

Continuing with the present embodiment, a high k dielectric material layer 212 is formed on the semiconductor substrate 202. The high-k dielectric layer 212 includes a dielectric material having the dielectric constant higher than that of thermal silicon oxide, about 3.9. The high k dielectric material layer 212 is formed by a suitable process such as ALD. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes $HfO_2$. Alternatively, the high k dielectric material layer includes metal nitrides, metal silicates or other metal oxides. In addition, an interfacial layer may be formed between the high-k dielectric material layer 212 and the substrate 202.

A polysilicon layer 220 is formed above the high-k dielectric material layer 212. The polysilicon layer 220 is formed by a proper technique, such as CVD. In one example, the polysilicon layer 220 is non-doped. In another example, the polysilicon layer 220 has a thickness between about 500 angstrom and about 1000 angstrom.

The polysilicon layer 220 is patterned, as shown in FIG. 2. Patterning the polysilicon layer 220 can be performed in various manners, such as by using a patterned mask, followed by an etch process. In the present embodiment, the gate dielectric 212 is also patterned. As a result, a dummy gate is formed, as shown in FIG. 2.

Execution proceeds to step 104, in which source and drain features 206 are formed in the substrate 202. In the present embodiment, a gate spacer 214 is formed on the sidewalls of the dummy gate 220. The gate spacer 214 includes one or more dielectric material, such as silicon oxide, silicon nitride, silicon oxynitride or combinations thereof. The source and drain 206 include doping species introduced to the semiconductor substrate 202 by a proper technique, such as ion implantation. In one embodiment, the gate stack is configured in the active region for an n-type field effect transistor (nFET), and the dopant of the source and drain is n-type dopant, such as phosphorus or arsenic. In another embodiment, the gate stack is configured in the active region for a p-type field effect transistor (pFET), and the dopant of the source and drain is p-type dopant, such as boron or gallium. In yet another embodiment, the source and drain 206 include light doped drain (LDD) and heavily doped features, as shown in FIG. 2.

The method 100 proceeds to step 106 by forming an interlayer dielectric (ILD) 230 on the substrate. The ILD 230 is deposited by a proper technique, such as CVD. The ILD 230 includes a dielectric material, such as silicon oxide, low k dielectric material or a combination. A chemical mechanical polishing (CMP) process may be applied thereafter to planarize the surface of the ILD 230.

The method 100 proceeds to step 108 by removing the polysilicon layer 220, resulting a gate trench. The polysilicon is removed by a suitable etching process, such as wet etch. At step 110, a metal gate stack is formed in the gate trench, which is discussed in greater detail below with reference to FIGS. 3 and 4.

Figure 3:
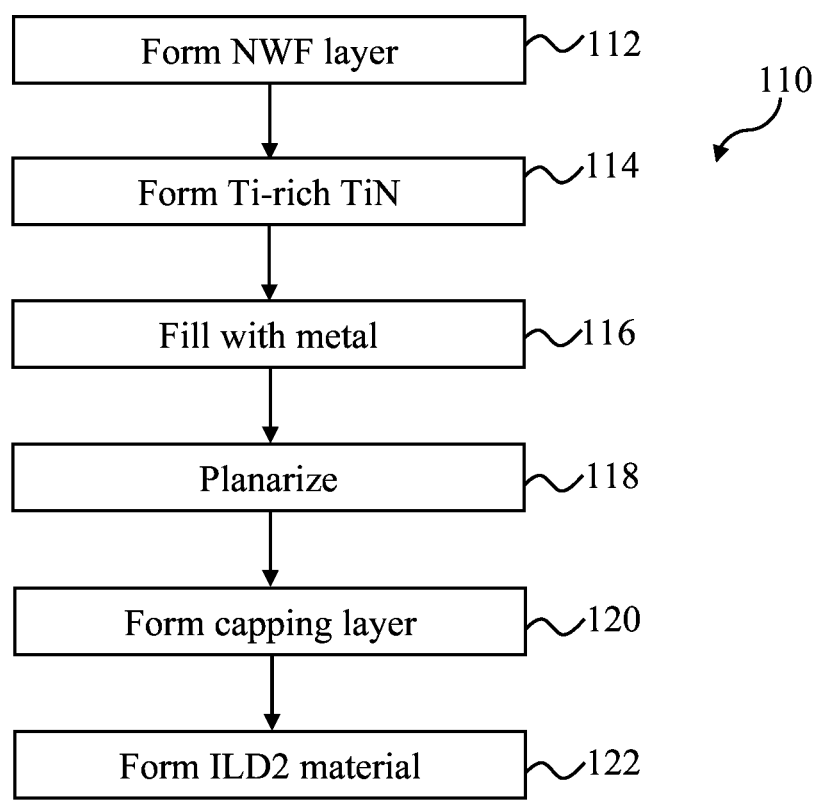
Figure 4:
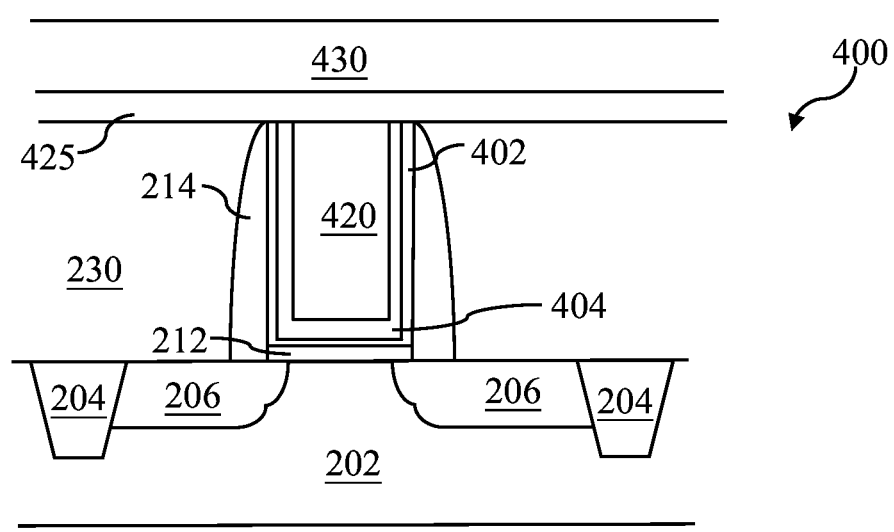

Referring to FIG. 3, forming the metal gate stack begins at step 112 by forming a first metal layer 402 having a proper work function. The first metal is also referred to as work function metal. For an nFET, the first metal 402 has a work function substantially equals to or less than about 4.4 eV, referred to as n metal. For a pFET, the first metal 402 has a work function substantially equals to or greater than about 4.8 eV, referred to as p metal. In the present example, an n metal work function (NWF) layer is formed, and includes tantalum or titanium aluminum. In another example, the p metal includes titanium nitride or tantalum nitride. The work function metal 402 is deposited by a suitable technique. In the present embodiment, the NWF is deposited by PVD.

At step 114, a blocking layer 404 is formed above the work function metal. Continuing with the example above, the blocking layer is a TiN layer. The TiN layer is titanium-rich, meaning that Ti/N>1. In the present embodiment, the TiN is deposited by PVD.

At step 116, a fill metal material 420 is deposited in the trench, above the blocking layer 404. In the present embodiment, the fill metal material 420 includes aluminum, although it is understood that other embodiments may be provided, such as aluminum copper alloy. The fill metal material 420 is deposited by a suitable technique, such as PVD or plating. At step 118, the metal gate is planarized. In one embodiment, a CMP process is applied to remove the excessive metals, including any metals disposed on the ILD 230. The combination of the layers 402, 404, and 420 form a replacement metal gate for the trench left over from the polysilicon dummy gate 220 (FIG. 2). It is understood that additional layers may also be included in the replacement metal gate.

At step 120, a capping layer is formed over the replacement metal gate. In the present embodiment, a non-silane oxide layer 425 is deposited on the replacement metal gate, such as by chemical vapor deposition (CVD) or atomic layer deposition (ALD). In more specific embodiments, the non-silane oxide layer includes TEOS ($Si(C_2H_5O)_4$) or SAM24 ($C_8H_{22}N_2Si$) according to one of the following formulas:

$TEOS + O_2$ w/i HF plasma => $SiO_2$

$SAM24 + O_2$ w/i HF plasma => $SiO_2$

Equation (1) is an example of plasma-enhanced TEOS, and equation (2) is an example of ALD oxide.

At step 122, a second ILD 430 is formed on the substrate. The ILD 430 is deposited by a proper technique, such as CVD or spin-on glass. The ILD 430 includes a dielectric material, such as silicon oxide, low k dielectric material or a combination. A chemical mechanical polishing (CMP) process may be applied thereafter to planarize the surface of the ILD 430.

Other processing steps may follow to form a functional circuit. For example, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

The present disclosure is not limited to applications in which the semiconductor structure includes a filed effect transistor, such as a metal-oxide-silicon (MOS) transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metal. The footing procedure may implement other effective cleaning procedure. The disclosed method is used to but not limited to form one transistor, such as an n-type metal-oxide-semiconductor field-effect-transistor (nMOSFET). For example, a plurality of nMOSFETs and a plurality of p-type metal-oxide-semiconductor field-effect-transistors (pMOSFETs) are formed in the same substrate, the nMOSFETs and pMOSFETs are formed in a collective procedure where some features are respectively formed. In a particular example, the n metal is formed in the nMOSFET regions while pMOSFET regions are covered from the deposition of n metal.

In another embodiment, the semiconductor substrate may include an epitaxial layer. For example, the substrate may have an epitaxial layer overlying a bulk semiconductor. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

According to one embodiment, the present disclosure describes a semiconductor structure. The semiconductor structure includes a semiconductor substrate and a gate stack disposed on the semiconductor substrate. The gate stack includes a high-k dielectric material layer, a titanium-rich TiN layer over the high-k dielectric layer, and a metal layer disposed over the titanium-rich TiN layer. In some embodiments, the metal layer includes aluminum.

The present disclosure also describes another semiconductor structure, including a semiconductor substrate and a gate stack disposed on the semiconductor substrate. The gate stack in this embodiment includes a high-k dielectric material layer, a metal layer disposed over the high-k dielectric material layer, and a non-silane based oxide capping the metal layer. In some embodiments, the metal layer includes aluminum.

The present disclosure also describes a method of forming a semiconductor structure. The method includes forming a working function layer over the semiconductor substrate, forming a titanium-rich TiN layer over the working function layer, and forming a metal gate structure over the titanium-rich TiN layer. In some embodiments, the metal gate includes aluminum. Also in some embodiments, the method includes forming a capping layer over the metal gate structure; the capping layer formed using a non-silane oxide process.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a semiconductor substrate;
   a gate stack disposed on the semiconductor substrate, wherein the gate stack includes:
      a high-k dielectric material layer;
      an n-type work function layer disposed directly on the high-k dielectric material layer and having a side portion extending to a topmost surface of the gate stack;
      a titanium-rich TiN layer disposed directly on the n-type work function layer and having a side portion extending to the topmost surface of the gate stack; and
      a metal layer disposed directly on the titanium-rich TiN layer;
   an interlayer dielectric (ILD) disposed on the semiconductor substrate adjacent the gate stack; and
   a capping layer disposed on a substantially planar surface defined by the topmost surface of the gate stack and a top portion of the ILD, wherein the capping layer and the ILD are different in composition.

2. The semiconductor structure of claim 1, wherein the metal layer includes aluminum.

3. The semiconductor structure of claim 1, wherein the capping layer includes an oxide formed using at least one of: $Si(C_2HSO)_4$ or $C_8H_{22}N_2Si$.

4. The semiconductor structure of claim 1, wherein n-type work function layer has a work function substantially equal to or less than about 4.4 eV.

5. The semiconductor structure of claim 1, wherein the structure is part of an nFET, and further comprises:
   source and drain regions in the substrate, on either side of the gate stack.

6. A semiconductor structure, comprising:
   a semiconductor substrate;
   a gate stack disposed on the semiconductor substrate, wherein the gate stack includes:
      a high-k dielectric material layer,
      an n-type work function metal film disposed over the high-k dielectric layer and extending to a topmost surface of the gate stack;
      a blocking layer disposed directly on the n-type work function metal film and extending to the topmost surface of the gate stack, wherein the blocking layer includes TiN with a Ti/N ratio greater than 1;
      a metal layer disposed over the blocking layer; and
      a non-silane based oxide capping layer disposed over the metal layer; and
   an interlayer dielectric disposed on the semiconductor substrate and having a topmost surface substantially coplanar with the topmost surface of the gate stack,
   wherein the non-silane based oxide capping layer is disposed on a portion of the topmost surface of the interlayer dielectric and a portion of the topmost surface of the gate stack.

7. The semiconductor structure of claim 6, wherein the metal layer includes aluminum.

8. The semiconductor structure of claim 6, wherein the non-silane based oxide includes TEOS.

9. The semiconductor structure of claim 6, wherein the non-silane based oxide includes SAM24.

10. The semiconductor structure of claim 6, wherein the n-type work function metal film has a work function substantially equals to or less than about 4.4 eV.

11. The semiconductor structure of claim 6, wherein the structure is part of an nFET, and further comprises:
   source and drain regions in the substrate, on either side of the gate stack.

12. A semiconductor device comprising:
   a substrate;
   a gate structure disposed thereupon, wherein the gate structure includes:
      a dielectric layer disposed on the substrate;
      an n-type work function layer disposed on the dielectric layer;
      a blocking layer disposed on the n-type work function layer, wherein the blocking layer includes TiN with a Ti/N ratio of greater than 1, and further wherein the blocking layer is disposed on a horizontal surface of the n-type work function layer opposite the substrate and on at least one vertical surface of the n-type work function layer; and
      a fill material disposed on the blocking layer; and
   a capping layer disposed on the gate structure, wherein the capping layer has a bottom surface defined by the gate structure that extends beyond the gate structure, and wherein the bottom surface of the capping layer physically contacts the n-type work function layer, the blocking layer, and the fill material.

13. The semiconductor device of claim 12, wherein the blocking layer extends along the entirety of the at least one vertical surface of the work function layer.

14. The semiconductor structure of claim 6, wherein the oxide and the interlayer dielectric are different in composition.

15. The semiconductor structure of claim 1, wherein the titanium-rich TiN layer is free of at least one metal included in the n-type work function layer.

16. The semiconductor structure of claim 1, wherein the n-type work function layer includes at least one of: Ta or TiAl.

17. The semiconductor structure of claim 1, wherein the capping layer physically contacts the n-type work function layer, the titanium-rich TiN layer, and the metal layer.

18. The semiconductor structure of claim 6, wherein the blocking layer is free of at least one metal included in the n-type work function metal film.

19. The semiconductor structure of claim 6, wherein the n-type work function metal film includes at least one of: Ta or TiAl.

\* \* \* \* \*